(12) United States Patent
Graziosi et al.

(10) Patent No.: US 12,068,276 B2
(45) Date of Patent: Aug. 20, 2024

(54) SEMICONDUCTOR DEVICE AND CORRESPONDING METHOD OF MANUFACTURE

(71) Applicant: STMicroelectronics S.r.l., Agrate Brianza (IT)

(72) Inventors: Giovanni Graziosi, Vimercate (IT); Michele Derai, Milan (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 595 days.

(21) Appl. No.: 17/344,149

(22) Filed: Jun. 10, 2021

(65) Prior Publication Data
US 2021/0305203 A1  Sep. 30, 2021

Related U.S. Application Data

(63) Continuation-in-part of application No. 16/745,043, filed on Jan. 16, 2020, now Pat. No. 11,764,134.

(51) Int. Cl.
*H01L 23/495* (2006.01)
*H01L 23/00* (2006.01)
(Continued)

(52) U.S. Cl.
CPC ............ *H01L 24/82* (2013.01); *H01L 23/295* (2013.01); *H01L 23/3135* (2013.01);
(Continued)

(58) Field of Classification Search
CPC .......... H01L 21/02098; H01L 23/5389; H01L 24/82; H01L 23/295; H01L 23/3135;
(Continued)

(56) References Cited

U.S. PATENT DOCUMENTS 6,611,434 B1   8/2003   Lo et al.
7,960,816 B2   6/2011   Chow et al.
(Continued)

FOREIGN PATENT DOCUMENTS

JP   S61134060 A   6/1986
JP   S63132459 A   6/1988
(Continued)

OTHER PUBLICATIONS

IT Search Report and Written Opinion for IT Appl. No. 102019000000929 dated Sep. 30, 2019 (8 pages).

*Primary Examiner* — Suberr L Chi
(74) *Attorney, Agent, or Firm* — Crowe & Dunlevy LLC

(57) ABSTRACT

Disclosed herein is a method, including attaching a semiconductor chip to a chip mounting portion on at least one leadframe portion, and attaching a passive component on a passive component mounting portion of the at least one leadframe portion. The method further includes forming a laser direct structuring (LDS) activatable molding material over the semiconductor chip, passive component, and the at least one leadframe portion. Desired patterns of structured areas are formed within the LDS activatable molding material by activating the LDS activatable molding material. The desired patterns of structured areas are metallized to form conductive areas within the LDS activatable molding material to thereby form electrical connection between the semiconductor chip and the passive component. A passivation layer is formed on the LDS activatable molding material.

13 Claims, 9 Drawing Sheets

(51) Int. Cl.
*H01L 23/29* (2006.01)
*H01L 23/31* (2006.01)
*H01L 23/64* (2006.01)

(52) U.S. Cl.
CPC ...... *H01L 23/49589* (2013.01); *H01L 23/645* (2013.01); *H01L 23/647* (2013.01); *H01L 24/48* (2013.01); *H01L 24/96* (2013.01); *H01L 23/49513* (2013.01); *H01L 23/49582* (2013.01); *H01L 24/92* (2013.01); *H01L 2224/24105* (2013.01); *H01L 2224/24175* (2013.01); *H01L 2224/24195* (2013.01); *H01L 2224/48245* (2013.01); *H01L 2224/48265* (2013.01); *H01L 2224/82101* (2013.01); *H01L 2224/82106* (2013.01); *H01L 2224/92244* (2013.01); *H01L 2924/186* (2013.01)

(58) Field of Classification Search
CPC ............ H01L 23/49589; H01L 23/645; H01L 23/647; H01L 24/48; H01L 24/96
See application file for complete search history.

(56) References Cited

U.S. PATENT DOCUMENTS

| | | |
|---|---|---|
| 2002/0195693 A1 | 12/2002 | Liu et al. |
| 2008/0023843 A1 | 1/2008 | Hiraga |
| 2019/0088621 A1* | 3/2019 | Yang ................... H01L 23/5385 |
| 2019/0115287 A1 | 4/2019 | Derai et al. |
| 2019/0274219 A1 | 9/2019 | Gottwald et al. |
| 2021/0305203 A1 | 9/2021 | Graziosi et al. |

FOREIGN PATENT DOCUMENTS

| | | |
|---|---|---|
| JP | H09199666 A | 7/1997 |
| JP | H10070234 A | 3/1998 |

* cited by examiner

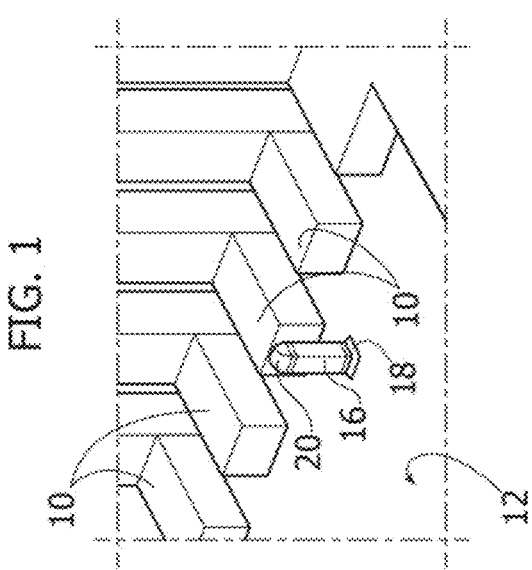
FIG. 1
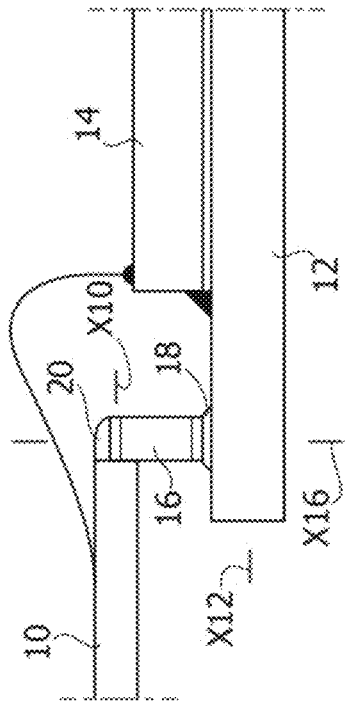
FIG. 2
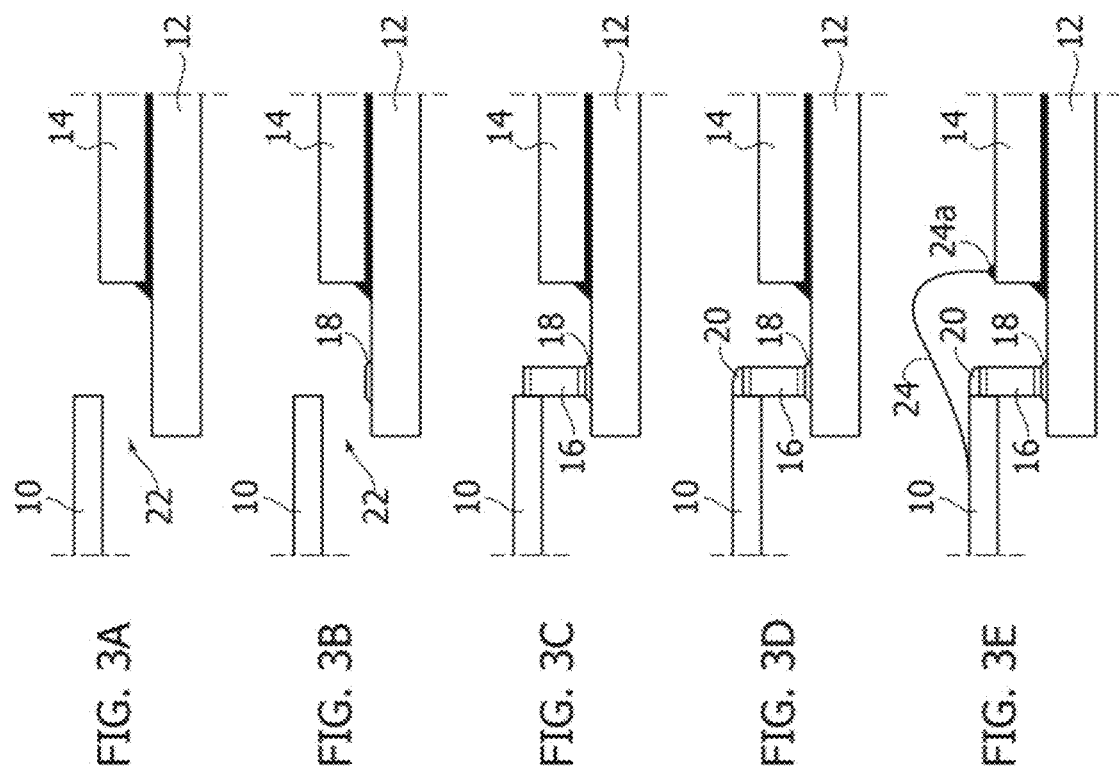
FIG. 3A
FIG. 3B
FIG. 3C
FIG. 3D
FIG. 3E

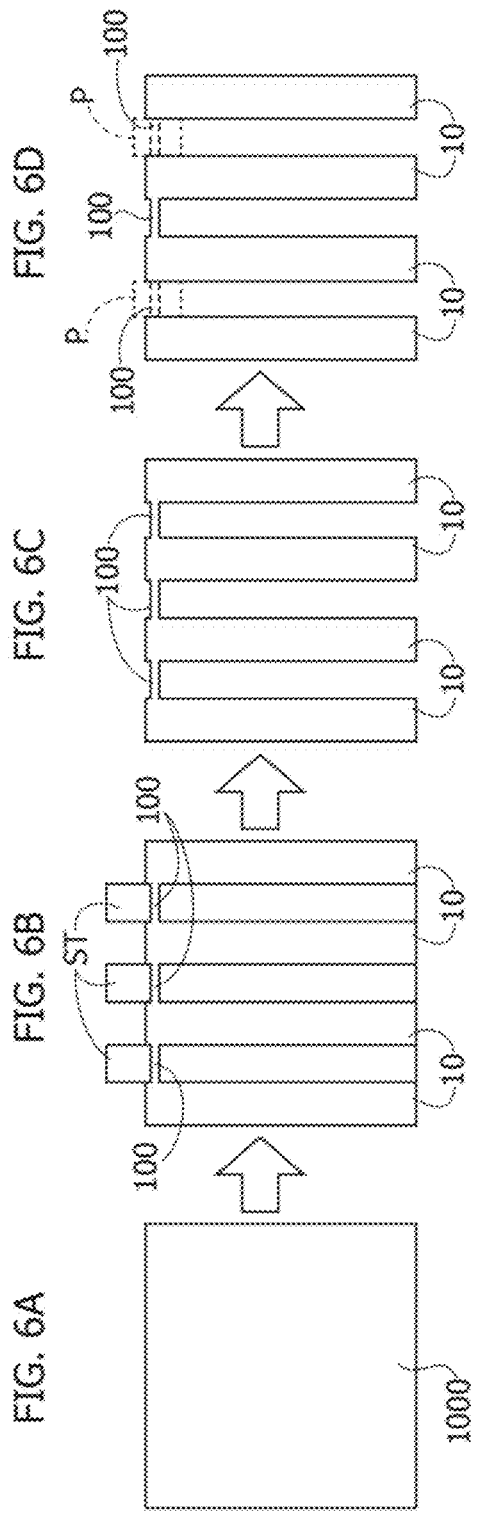
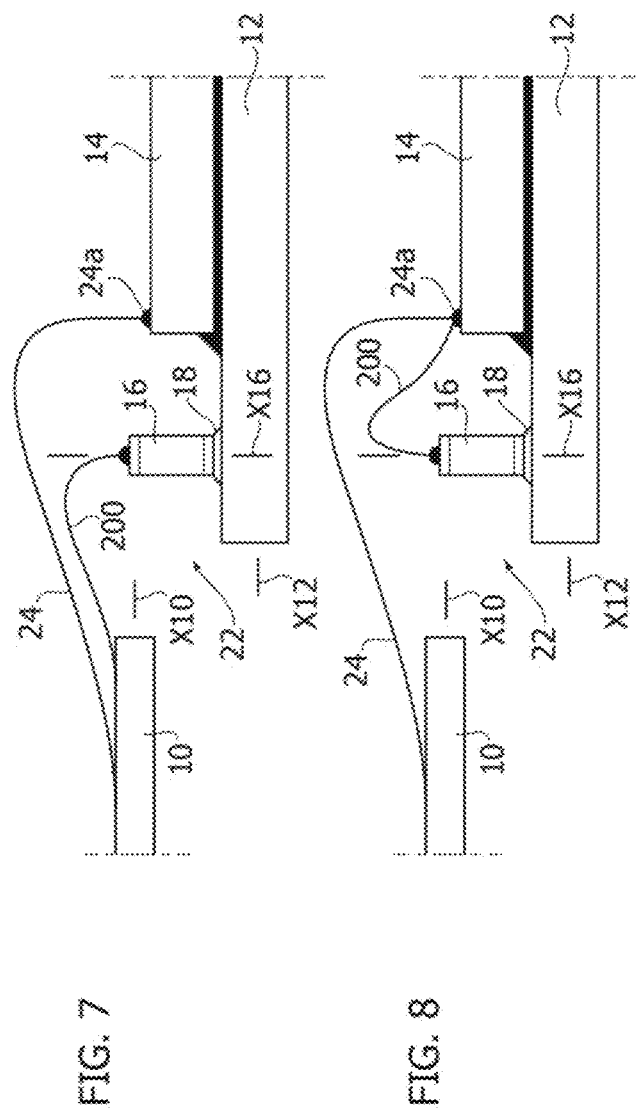

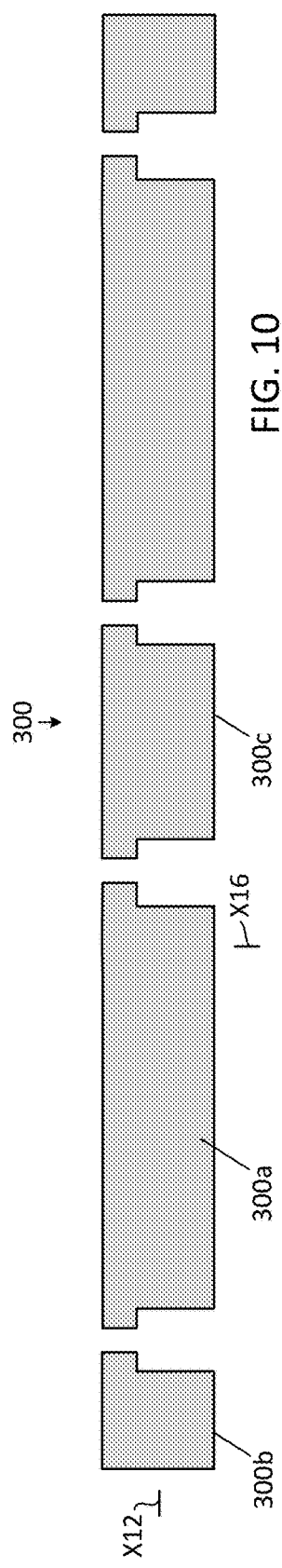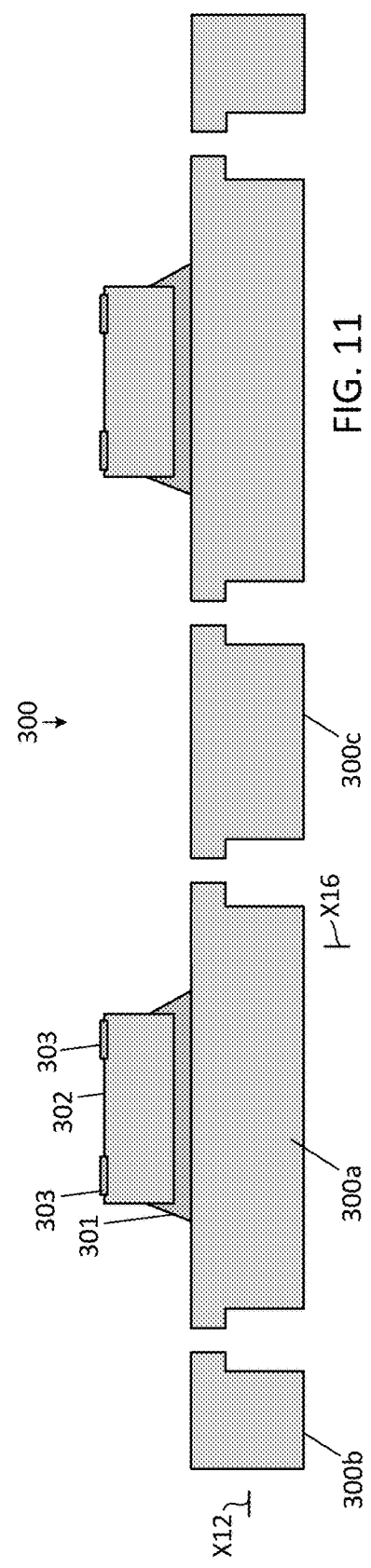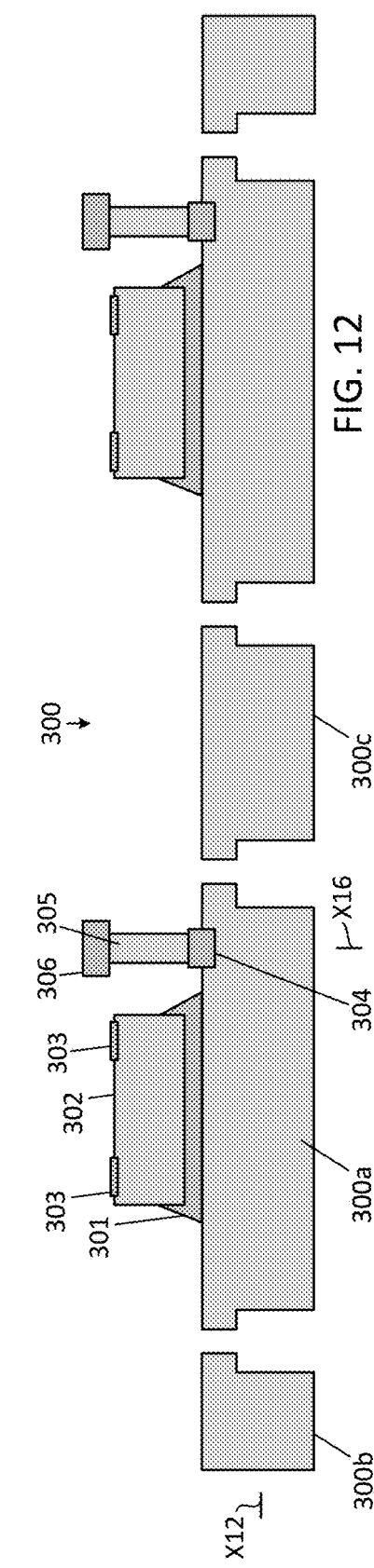

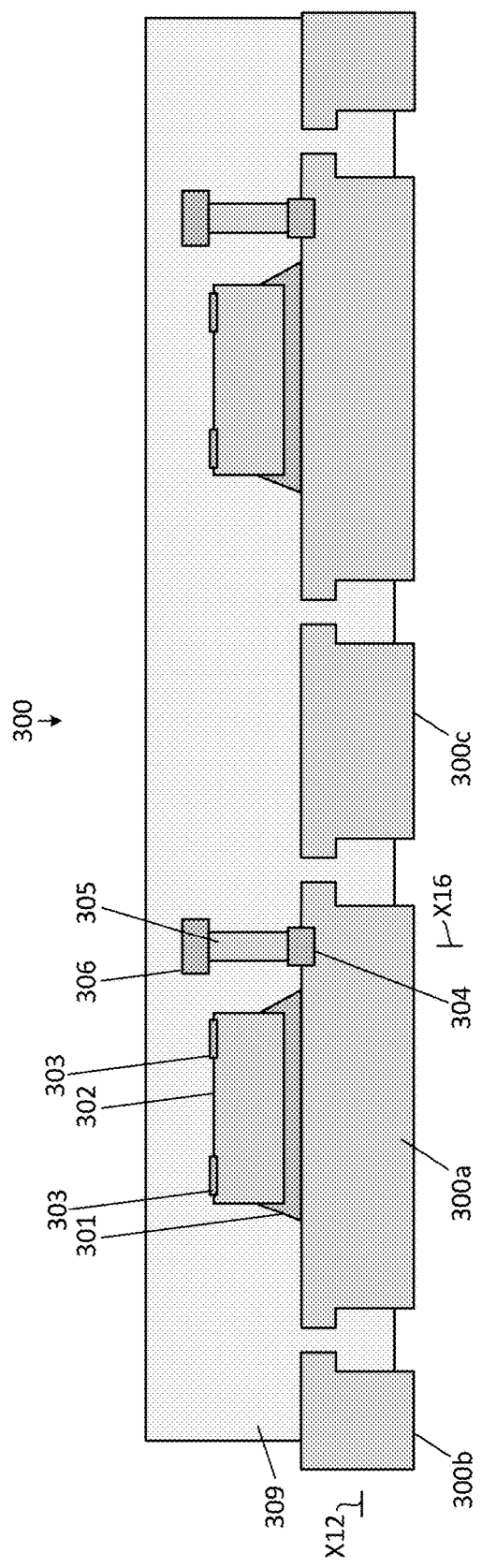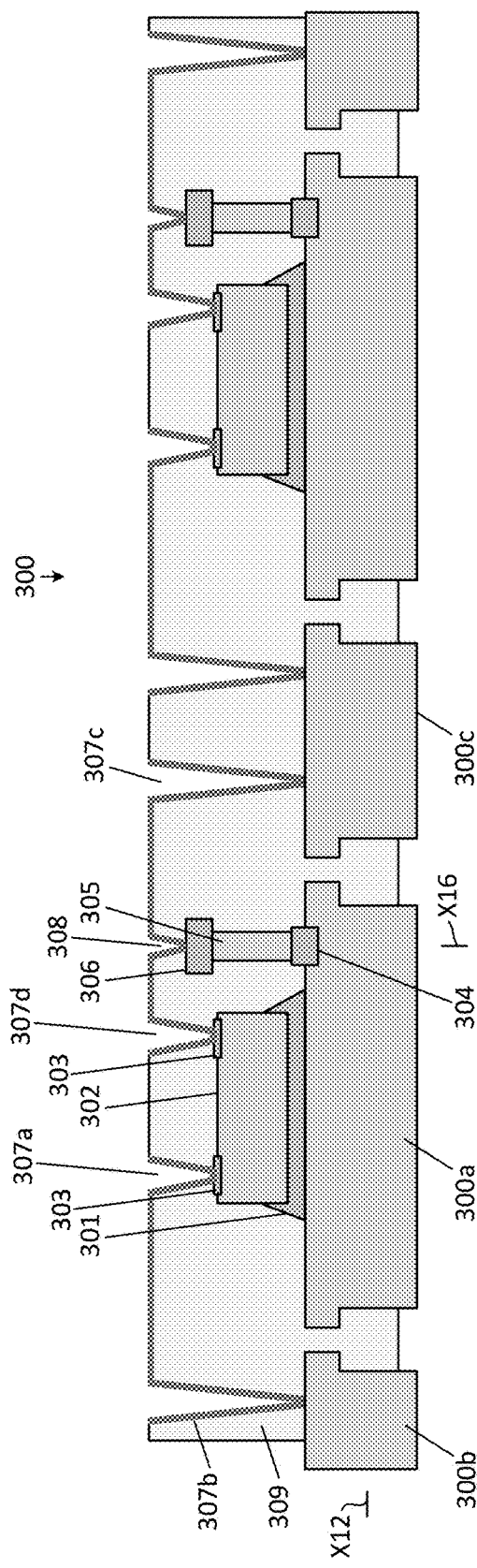

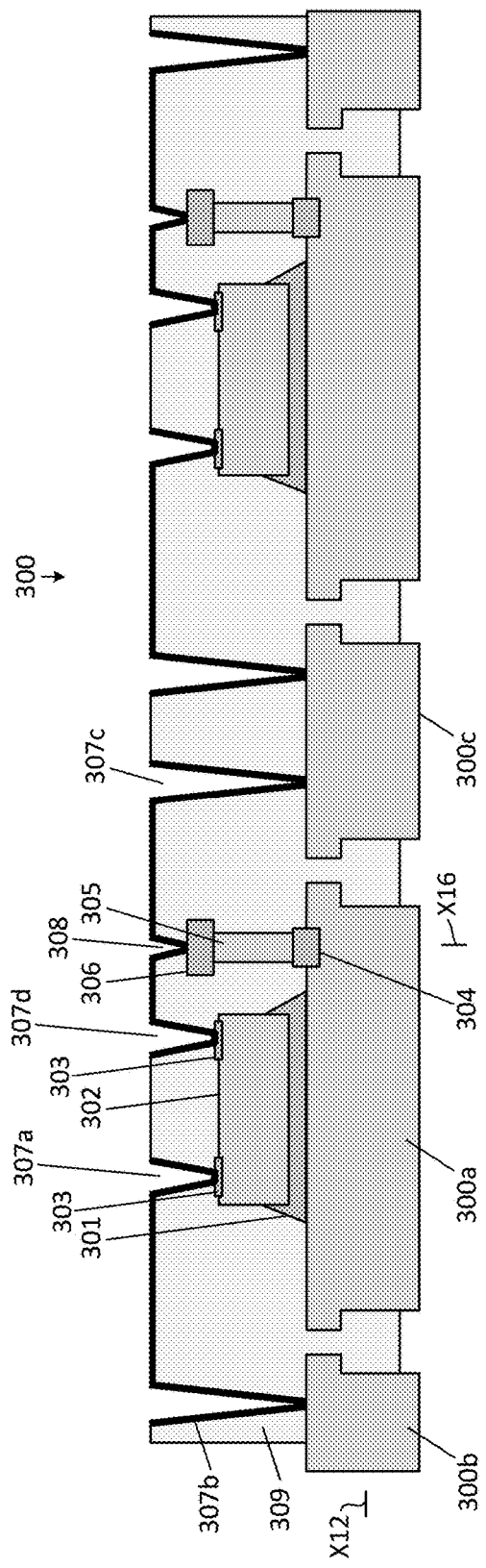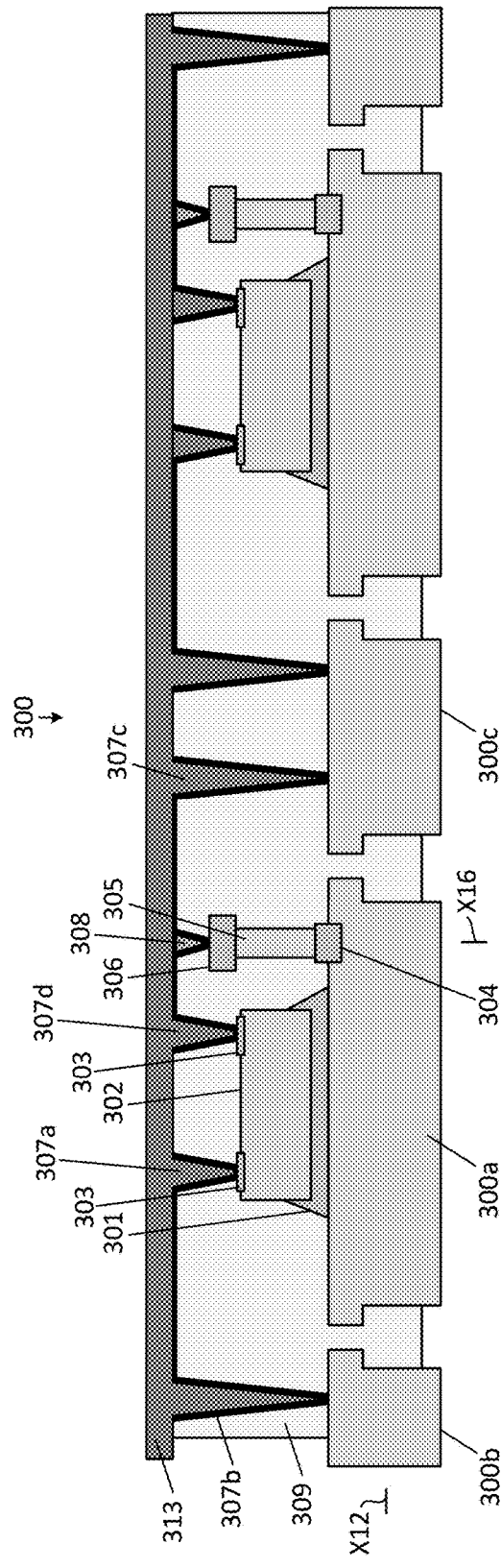

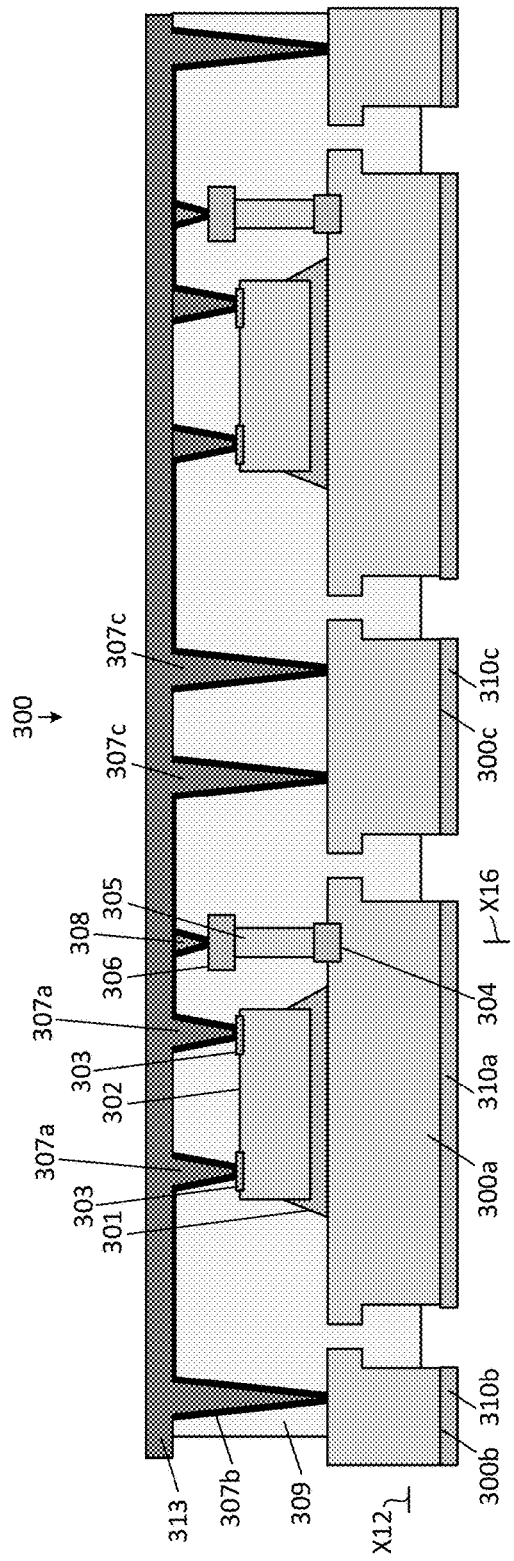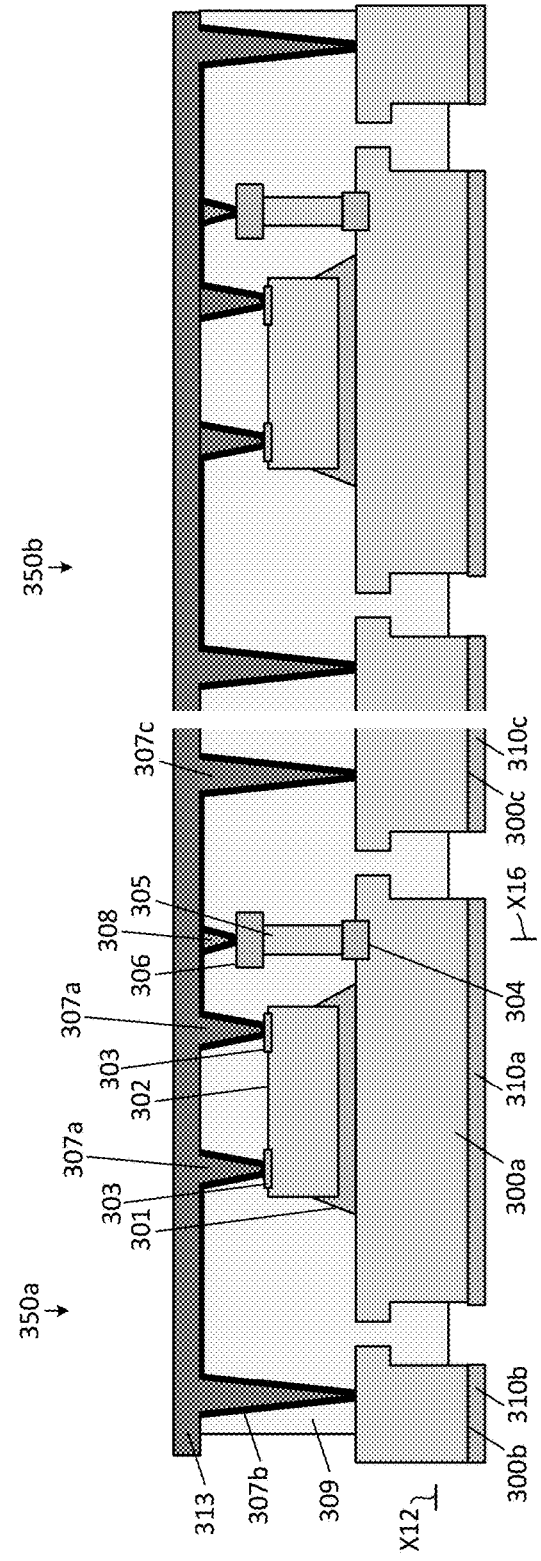

SEMICONDUCTOR DEVICE AND CORRESPONDING METHOD OF MANUFACTURE

PRIORITY CLAIM

This application is a continuation-in-part of U.S. patent application Ser. No. 16/745,043, filed Jan. 16, 2020, which claims the priority benefit of Italian Application for Patent No. 102019000000929, filed on Jan. 22, 2019, the contents of which are hereby incorporated by reference in their entireties to the maximum extent allowable by law.

TECHNICAL FIELD

This disclosure is related to semiconductor devices and, in particular, to techniques for forming a single layer system in package device including surface mounted passive devices.

BACKGROUND

Present-day printed circuit boards (PCBs) for integrated circuits are "populated" by (many) components such as integrated circuit (IC) devices (which may be arranged in plastic/ceramic packages), passive components, connectors and so on.

An increasing tendency exists towards integrating components (passive components such as capacitors, inductors, for instance) into the IC device packages, thereby removing them from the PCB surface.

Resorting to such an approach, oftentimes referred to as "system in package" or SiP, may be advantageous in terms of PCB space saved and may facilitate PCB miniaturization. Such an approach may be considered for application to arrangements where SMD (surface mount device) technology is adopted with a SMD electrically connected via electrically-conductive formations such as wire bonding and/or leads from a leadframe (LF).

Despite the extensive activity in that area, further improved techniques are desirable. For instance, improvements in terms of the impedance behavior exhibited by the components integrated in a package may be desirable.

There is accordingly a need in the art improved techniques.

Various techniques have been proposed for addressing issues related to electrical component integration in a semiconductor product package.

Documents such as U.S. Pat. Nos. 6,611,434 and 7,960, 816 or United States Patent Application Publication No. 2002/195693 are exemplary of such techniques (these documents being incorporated herein by reference).

Such techniques may suffer from various drawbacks related to poor electrical performance related to long connection formations as provided for coupling a (passive, for instance) electrical component to an integrated circuit (an application-specific integrated circuit or ASIC, for instance), with intermediate elements or substrate parts possibly intervening.

In addition, there is a trend toward embedding an increased number of components (e.g., passive components) in SiP devices, such as quad-flat no lead (QFN) devices, so as to save PCB space. This, however, can be challenging for smaller QFN devices, typically requiring two or three layers depending on package size, and therefore involving more complex and more expensive fabrication processes. While the use of multiple layers is undesirable, the desire for smaller and smaller QFN devices is ever increasing, and the desire to include passive components within QFN devices remains. As a consequence, further development into fabrication techniques and technologies is needed.

SUMMARY

According to one or more embodiments, a semiconductor device and a corresponding method of manufacturing semiconductor devices are provided.

One or more embodiments may comprise component integrated in a package (a SMD for instance) mounted "vertically" on a die-pad abutted against and coupled to a dedicated lead of the leadframe.

One or more embodiments were found to provide up to 40% impedance reduction in a capacitive component above 30 MHz.

One or more embodiments may provide a leadframe package including a two-terminal SMD mounted/coupled vertically on a die-pad and having its other terminal electrically coupled through a lead or a wire, for instance.

Disclosed herein is a method including: attaching a semiconductor chip to a chip mounting portion on at least one leadframe portion, and attaching a passive component on a passive component mounting portion of the at least one leadframe portion; and forming a laser direct structuring (LDS) activatable molding material over the semiconductor chip, passive component, and the at least one leadframe portion. The method further includes forming desired patterns of structured areas within the LDS activatable molding material, and metallizing the desired patterns of structured areas to form conductive areas within the LDS activatable molding material to thereby form electrical connection between the semiconductor chip and the passive component. The method further includes forming a passivation layer on the LDS activatable molding material.

The semiconductor chip may be attached to the chip mounting portion such that a longitudinal axis of the passive component is transverse to the passive component mounting portion.

The at least one leadframe portion may include first and second leadframe portions, attaching the semiconductor chip may include attaching the semiconductor chip to a chip mounting portion on the first leadframe portion, and attaching the passive component may include attaching passive component to a passive component mounting portion on the first leadframe portion.

The at least one leadframe portion may include first and second leadframe portions, attaching the semiconductor chip may include attaching the semiconductor chip to a chip mounting portion on the first leadframe portion, and attaching the passive component may include attaching passive component to a passive component mounting portion on the second leadframe portion.

The method may further include attaching a second semiconductor chip to a second chip mounting portion on at least one additional leadframe portion, and attaching a second passive component on a passive component mounting portion of the at least one leadframe portion. Forming the LDS activatable molding material may include forming the LDS activatable molding material over the semiconductor chip, second semiconductor chip, passive component, second passive component, and the at least one leadframe portion. Forming the desired patterns of structured areas within the LDS activatable molding material may include forming the desired patterns of structured areas within the LDS activatable molding material and metallizing the desired patterns of structured areas to form conductive areas within the LDS activatable molding material to thereby form electrical connections between the semiconductor chip and the passive component, and to thereby form electrical connections between the second semiconductor chip and the second passive component.

The at least one leadframe portion may include first and second leadframe portions. Attaching the semiconductor chip may include attaching the semiconductor chip to a chip mounting portion on the first leadframe portion, and attaching the second semiconductor chip may include attaching the second semiconductor chip to a second chip mounting portion on the second leadframe portion. Attaching the passive component may include attaching the passive component to a passive component mounting portion on the first leadframe portion, and attaching the second passive component may include attaching the second passive component to a second passive component mounting portion on the second leadframe portion.

The method may also include singulating the device into a first device formed of the first leadframe portion, the semiconductor chip, the passive component, and corresponding portions of the LDS activatable molding material and passivation layer, and a second device formed of the second leadframe portion, the second semiconductor chip, the second passive component, and corresponding portions of the LDS activatable molding material and passivation layer.

Metallizing the desired patterns of structured areas within the LDS activatable molding material may include performing an electroless deposition on the desired patterns of structured areas to thereby form a thin pattern, and then performing an electrodeposition to thicken the pattern to thereby form the conductive areas within the LDS activatable molding material.

BRIEF DESCRIPTION OF THE DRAWINGS

One or more embodiments will now be described, by way of example only, with reference to the annexed figures, wherein:

FIG. 1 is illustrative of a portion of a semiconductor device according to embodiments of the present description, FIG. 2 is a side-view representation of a portion of a semiconductor device according to embodiments of the present description, FIGS. 3A to 3E are exemplary of possible steps in producing an arrangement as exemplified in FIG. 2, FIGS. 4, 5 and 6A to 6D are exemplary of possible further steps in producing embodiments of the present description, FIG. 7 and FIG. 8 are side-view representations of a portion of a semiconductor device according to embodiments of the present description, FIG. 10 is a cross-sectional view of a system in a package (SiP), at a beginning of fabrication, as disclosed herein, FIG. 11 is a cross-sectional view of the SiP of FIG. 10 under fabrication in a step of die attachment, FIG. 12 is a cross-sectional view of the SiP of FIG. 10 under fabrication in a step of surface mounted device attachment, FIG. 13 is a cross-sectional view of the SiP of FIG. 10 under fabrication in a step of compression molding, FIG. 14 is a cross-sectional view of the SiP of FIG. 10 under fabrication in a step of laser direct structuring, FIG. 15 is a cross-sectional view of the SiP of FIG. 10 under fabrication in a step of metallization, FIG. 16 is a cross-sectional view of the SiP of FIG. 10 under fabrication in a step of passivation layer deposition, FIG. 17 is a cross-sectional view of the SiP of FIG. 10 under fabrication in a step of tin plating, FIG. 18 is a cross-sectional view of the SiP of FIG. 10 as completed after singulation.

DETAILED DESCRIPTION

Figure 4:
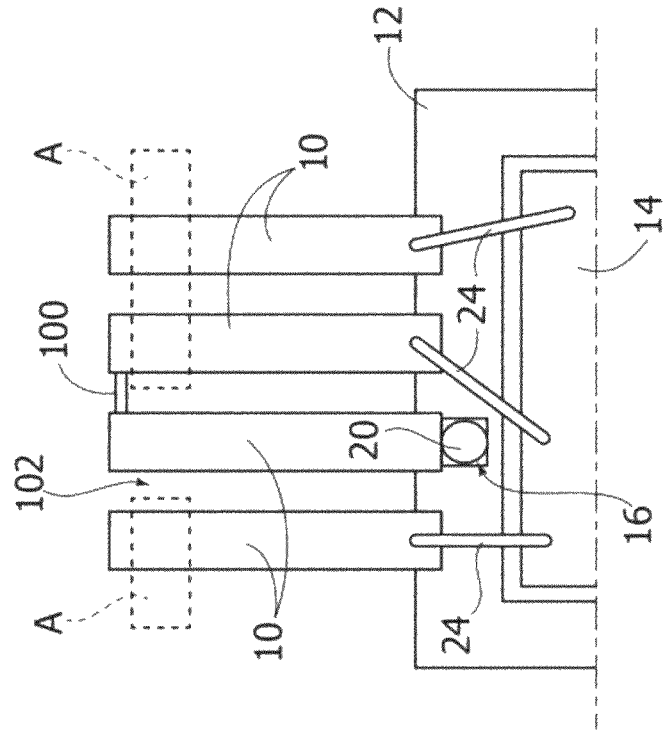

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

In addition, reference to a "passive" component herein means that such component is an electronic component that does not and/or cannot introduce net energy into the circuit.

The references used herein are provided merely for convenience and hence do not define the extent of protection or the scope of the embodiments.

FIG. 1 is exemplary of a portion of a semiconductor product package including one or more leads 10 in a leadframe (not visible in its entirety) having their inner ends facing and at least partially overlapping a portion 12 of the package (a so-called die-pad or slug) onto which one or more semiconductor chips or dice 14 are intended to be mounted (in a manner known to those of skill in the art).

Throughout the rest of this description, only one such semiconductor chip or die 14 will be considered for the sake of simplicity.

Reference 16 denotes an electrical component (a passive component such as a decoupling capacitor, for instance) arranged bridge-like between one (electrically-conductive) lead 10 and the (electrically-conductive) pad or slug 12 to provide electrical coupling therebetween.

In one or more embodiments as exemplified in FIG. 2 (and in FIGS. 7 and 8 as well), the lead 10 and the pad or slug 12 may be regarded as extending in respective—at least approximately parallel—(e.g. median) planes X10 and X12 which are mutually offset with the component 16 extending between these two planes.

In one or more embodiments, such electrical coupling can be provided—as discussed in the following—via electrically-conductive masses 18 and 20.

A SMD capacitor such as an EIA SIZE 0201 (length× width 0.6×0.3 mm) capacitor or an EIA SIZE 0402 (length× width 1.0×0.5 mm) capacitor may be exemplary of a component such as the component 16.

As exemplified herein, the component 16 may be of elongate form or shape, namely a form long in comparison to its width, for instance a length twice the width as in the case of the EIA SIZE 0201 or EIA SIZE 0402 capacitors mentioned previously by way of example.

In one or more embodiments, the component 16 may thus be mounted bridge-like between the lead 10 and the pad or slug 12 with a longitudinal axis X16 (that is the axis along the direction of longer or longest extension of the component 16) arranged transverse the pad or slug 12 (for example, perpendicular to the planes X10 and X12 and extending therebetween).

For instance, the component 16 may be mounted with the longitudinal axis X16 orthogonal to a plane of extension X12 of the pad or slug 12. For instance, by assuming that the pad or slug 12 may be regarded as lying in a horizontal plane X12, the elongate component 16 may be arranged with its axis X16 arranged vertically.

In the exemplary sequence of steps of FIGS. 3A to 3E, FIG. 3A shows a leadframe provided (in a manner known to those of skill in the art) with one or more leads 10 having a (inner) end facing a corresponding (peripheral, for instance) portion of the pad or slug 12 with a separation gap 22 therebetween.

As exemplified in FIG. 3A, the inner end of the lead 10 may overlap (that is, protrudes above) the portion of the pad or slug 12. It will be otherwise appreciated (see FIGS. 7 and 8 discussed in the following, for instance) that such an overlap is not a mandatory feature.

In FIG. 3A a semiconductor chip or die 14 is shown already attached (in any manner known to those of skill in the art) onto the pad or slug 12.

FIG. 3B is exemplary of an act of providing onto the die-pad or slug 12 a (first) electrically-conductive mass (vertically) aligned with the end of the lead 10 protruding over the pad or slug 12.

In one or more embodiments, the mass 18 may comprise a preform or solder material applied onto the pad or slug 12 possibly after an agent (or flux) has been dispensed to facilitate firm adhesion of the mass 18 to the pad or slug 12.

FIG. 3C is exemplary of a component 16 being placed onto the mass 18 which, as discussed previously, may involve placing an elongate component 16 "vertically", that is with its main dimension X16 extending transverse to the pad or slug 12.

FIG. 3D is exemplary of a (second) mass of electrically-conductive material 20 being provided between the (upper) termination of the component 16 and the inner tip of the lead 10.

In one more embodiments, the mass 20 may include a preform or solder material. In one or more embodiments the act exemplified in FIG. 3D may also include solder reflow and agent (or flux) cleaning.

FIG. 3E is exemplary of the possible provision of (otherwise conventional) wire or ribbon bonding 24 to provide electrical coupling of the lead 10 with corresponding die pads (see reference 24a) at the front or upper surface of the semiconductor chip or die 14.

While advantageous for various aspects, the sequence of acts exemplified in FIGS. 3A to 3E is not mandatory. For instance, just to mention one possible alternative, the semiconductor die or chip 14 may be attached to the pad or slug 12—after—the component 16 has been arranged bridge-like across the gap 22 between the lead 10 and the pad or slug 12.

FIGS. 1 and 2 (and FIGS. 3C to 3E as well) are exemplary of the possibility for the component 16 to extend bridge-like between the chip mounting portion 12 and a lateral surface of the lead 10 in abutment with that lateral surface, thus extending sidewise of the lead 10 rather than being sandwiched between the lead 10 and the pad or slug 12.

As appreciable in FIGS. 1 and 2 (and FIGS. 3C to 3E as well), the lead 10 may exhibit a lateral surface, such as a "vertical" end surface transverse the plane X10 and/or X12, so that the component 16 can be abutted at its end (here an upper end) facing the lead 10 against the lateral surface of the lead 10.

As appreciable in FIGS. 1 and 2 (and FIGS. 3C to 3E as well), this may also facilitate placement from the top of the leadframe and/or using a component 16 having a length longer than the distance between the lead 10 and the pad or slug 12 as measured transverse (orthogonal) to the planes X10 and X12.

One or more embodiments may take into account the fact that in certain embodiments the lead 10 may be a power lead. A rigid joint to the pad or slug 12 as created via the electrical component 16 may thus be exposed to the risk of breaking as a result of the lead being clamped (at a clamping area A as exemplified in FIG. 4) at wire bonding.

In one or more embodiments, such an issue may be addressed by providing a physical connection (for instance a bridge contact as exemplified as 100 in FIG. 5) between the (power) lead 10 to which the component 16 is coupled and at least one adjacent lead 10 having such a rigid joint to the pad or slug 12.

Figure 5:
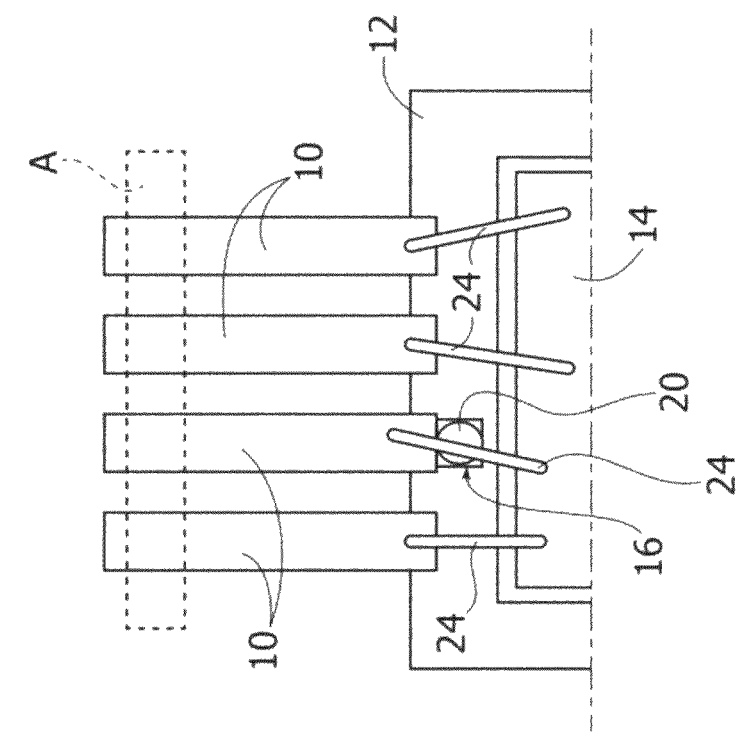

One or more embodiments may contemplate modifying the clamping foot design intended to act at the clamping area A by providing a gap therein as exemplified at 102 in FIG. 5.

A local relief can thus be provided at the lead 10 to which the component 16 is coupled by avoiding applying clamping force thereto, while—as exemplified in FIG. 5—a (power) wire coupling to the chip of die 12 may be provided for the power lead 10 to which the component 16 is coupled via an adjacent lead 10 (on the right, in FIG. 5) physically connected thereto (via the bridge contact 100, for instance).

The sequence of FIGS. 6A to 6D is exemplary of the possible provision of such a physical (mechanical) connection between adjacent leads 10, which may be provided via one or more bridges 100 as exemplified in FIG. 5.

Specifically, the sequence of FIGS. 6A and 6B is exemplary of a stamping process applied to a raw base material (e.g., copper in reel form) 1000 for the leadframe.

Stamping tool flexibility in such a process may facilitate (possibly during leadframe manufacturing by a supplier) adding/removing punches and changing their positions in order to provide a pin-to-pin (lead-to-lead) electrical connection (100, for instance) where desired.

For instance, FIG. 6B is exemplary of a stamping process via a stamping tool ST resulting in a plurality of leads 10 being physically (and also electrically) coupled to one another via bridges 100 as exemplified in FIG. 6C.

A stamping process as exemplified herein may include a further act of punching away (as exemplified at P in FIG. 6D) those pin-to-pin connection which may not be desired for a certain application.

The possibility of using a same lead 10 as a power lead for a plurality of semiconductor products (ICs, for instance) may facilitate adopting a standardized location of physical connection thus facilitating leadframe design standardization.

FIGS. 7 and 8 exemplify one or more embodiments applied to arrangements (such as QFP packages—QFP being an acronym for Quad Flat Package) including leads 10 facing a pad or slug 12 and defining a gap 22 therewith without protruding above the pad or slug 12.

Here again, the lead 10 and the pad or slug 12 may be regarded as extending in respective (at least approximately parallel) planes X10 and X12 (e.g., median planes of the lead 10 and the pad or slug 12, respectively) which are mutually offset with the component 16 extending between these two planes.

In one or more embodiments as exemplified in FIGS. 7 and 8 the electrically-conductive mass 20 discussed in the foregoing may be replaced by wire (or possibly ribbon) bonding 200 which electrically couples to the lead 10 the termination of the component 16 opposite to the pad or slug 12.

Such wire or ribbon bonding of the component 16 to the lead 10 may be:
- direct, as exemplified in FIG. 7, which may involve electrode finishing compatible with wire bonding technology,
- indirect, as exemplified in FIG. 8, that is via the die-pads 24*a* provided for the lead-to-die bonding 24 which may facilitate and optimized wire length.

One or more embodiments as exemplified in FIGS. 7 and 8 may retain the advantage of arranging an elongate component 16 such as an EIA SIZE 0201 or EIA SIZE 0402 capacitor transverse to the pad or slug 12 (vertical, for instance) thus reducing the footprint of the component 16 on the pad or slug 12.

One or more embodiments as exemplified in FIGS. 7 and 8 are again exemplary of the possibility for the component 16 to have a length longer than the distance between the lead 10 and the pad or slug 12, as measured transverse (orthogonal) to the planes X10 and X12, as a result of extending sidewise of the lead 10.

Figure 9:
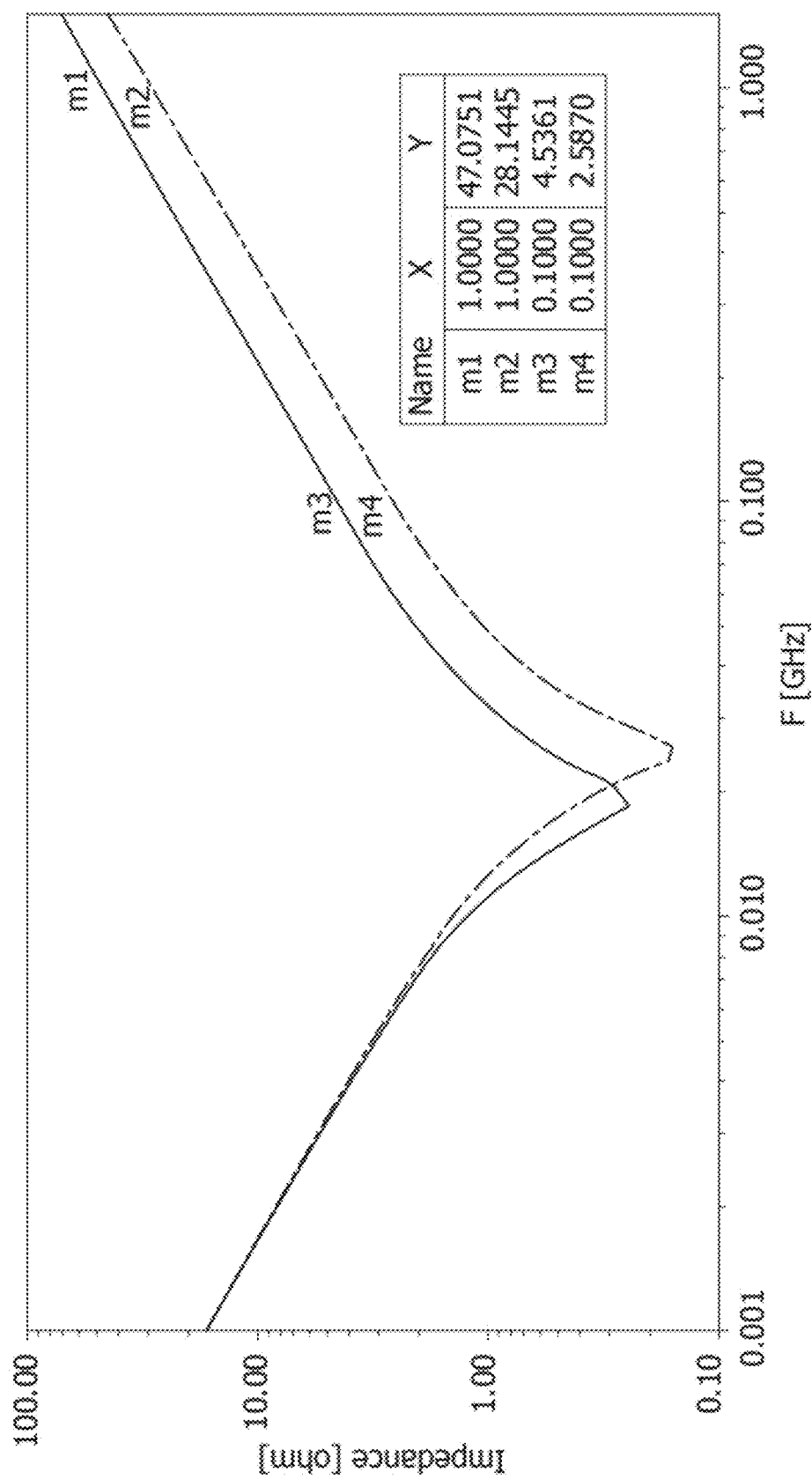
FIG. 9 is a diagram exemplary of a possible impedance versus frequency behavior in embodiments of the present description.
Figure 19:
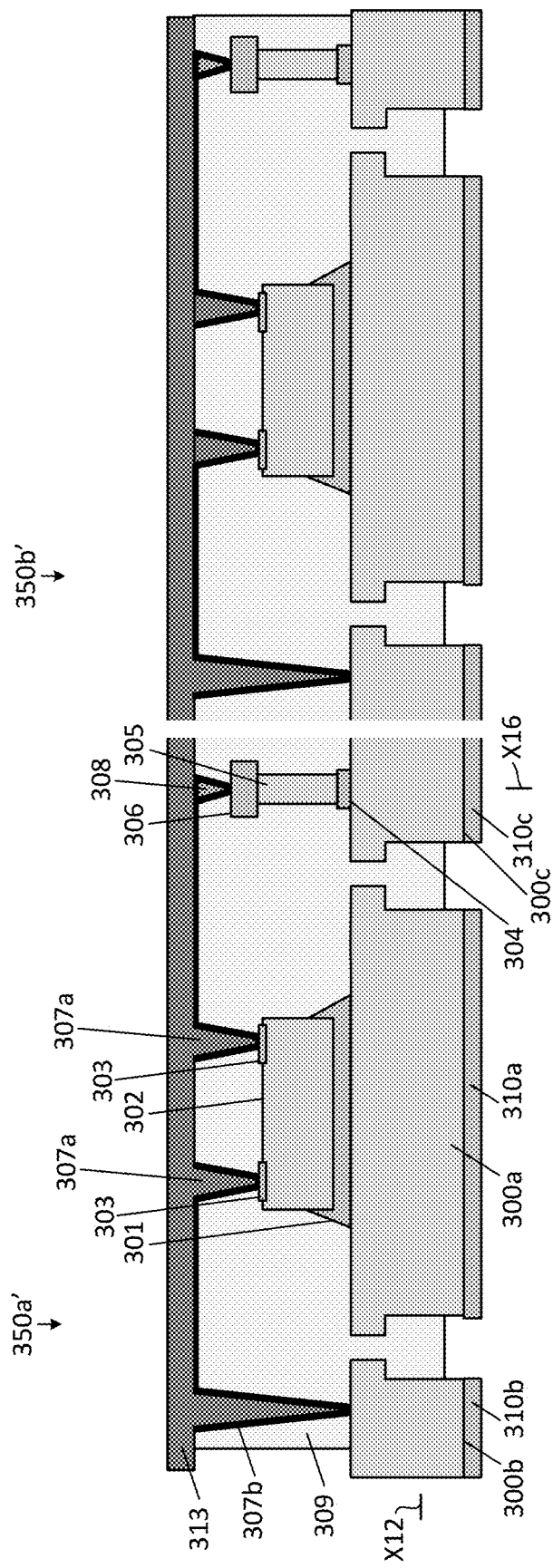
FIG. 19 is a cross-sectional view of an alternative embodiment of a SiP, as disclosed herein.

The diagram of FIG. 9 is exemplary of the impedance (Ohm) measured over a frequency range between 0.001 and 1.000 GHz for a 0201 SMD capacitor having a nominal capacitance value of 10 nF.

The impedance behavior for a capacitor assembly according to embodiments of the present description as (illustrated by the dash-dot line in FIG. 9) shows an improvement in excess of 40% in comparison with the impedance behavior for a conventional capacitor assembly (shown in continuous line) over the whole of the frequency range above the frequency where the lowest impedance is measured.

One or more embodiments may thus provide an optimized electrical connection from a ground electrode (as provided by the pad or slug 12) to the back side of the die 14 achieved through a slug and not through a wire, while also exhibiting a shorter wire connection from the leads 10 (for instance a power lead) to the die 14.

One or more embodiments may facilitate reducing (notionally halving) the number of dedicated power supply pins in a semiconductor device such as an integrated circuit in comparison with conventional planar SMD assembly, while also facilitating leadframe design standardization as discussed previously.

A device as exemplified herein may comprise: at least one semiconductor chip (for instance, 14); a leadframe (for instance, 10, 12) comprising a chip mounting portion (for instance, 12) having the at least one semiconductor chip thereon and at least one lead (for instance, 10) arranged facing the chip mounting portion, the at least one lead lying in a first plane (for instance, X10) and the chip mounting portion lying in a second plane (for instance, X12), the first plane and the second plane mutually offset with a gap (for instance, 22) therebetween; and an electrical component (for instance, 16) arranged on the chip mounting portion and extending between the first plane and the second plane.

A device as exemplified herein may comprise an elongate electrical component extending along a longitudinal axis (for instance, X16), the electrical component arranged on the chip mounting portion with said longitudinal axis transverse (for instance, orthogonal to) the second plane.

A device as exemplified herein may comprise: a first electrically-conductive formation (for instance, 18) electrically coupling the chip mounting portion and the electrical component arranged on the chip mounting portion; and at least one second electrically-conductive formation (for instance, 20; 200; 200, 24) electrically coupling the electrical component to the at least one lead arranged facing the chip mounting portion.

In a device as exemplified herein, the first electrically-conductive formation may comprise electrically-conductive material electrically and mechanically coupling the electrical component and the chip mounting portion.

In a device as exemplified herein said at least one lead may be arranged facing and at least partially overlapping the chip mounting portion (see, for instance, FIG. 2), the electrical component extending bridge-like between the chip mounting portion and the at least one lead arranged facing the chip mounting portion.

In a device as exemplified herein the second electrically-conductive formation may comprise electrically-conductive material electrically and mechanically (see, for instance 20 in FIG. 2) coupling the electrical component to the at least one lead arranged facing and at least partially overlapping the chip mounting portion.

In a device as exemplified herein, the at least one second electrically-conductive formation may comprise wire-like (wire or ribbon) material (for instance, 200 or 200, 24) electrically coupling the electrical component to the at least one lead arranged facing the chip mounting portion either directly (see, for instance 200 in FIG. 7) or (see, for instance 200, 24 in FIG. 8) via the at least one semiconductor chip on the chip mounting portion.

In a device as exemplified herein (see, for instance, FIGS. 1 and 2 and FIGS. 3C to 3E), the electrical component (for instance, 16) may extend sidewise of the at least one lead between the chip mounting portion and a lateral surface of the at least one lead in abutment with said lateral surface.

In a device as exemplified herein (see, for instance, FIGS. 1 and 2 and FIGS. 3C to 3E plus FIGS. 7 and 8,) the electrical component may have a length longer than the distance between said chip mounting portion and said at least one lead transverse (orthogonal to, for instance) said first plane and said second plane.

A device as exemplified herein may comprise: at least one second lead (see, for instance, the third lead 10 from left in FIG. 5) in the leadframe arranged sidewise said at least one lead arranged facing the chip mounting portion, the at least one second lead mechanically and electrically coupled (100) to said at least one lead in the leadframe arranged facing the chip mounting portion; and wire-like (for instance, wire of ribbon) bonding (see FIG. 5) between the at least one semiconductor chip on the chip mounting portion and the at least one second lead in the leadframe, wherein the electrical component is electrically coupled to the at least one semiconductor chip on the chip mounting portion via said wire-like bonding between the at least one semiconductor chip on the chip mounting portion and said at least one second lead in the leadframe.

A method of manufacturing a device as exemplified herein may comprise: arranging the at least one semiconductor chip on the chip mounting portion of the leadframe, the leadframe having said at least one lead arranged facing the chip mounting portion, the at least one lead lying in a first plane and the chip mounting portion lying in a second plane, the first plane and the second plane mutually offset with a gap therebetween; and arranging the electrical component on the chip mounting portion (the electrical component) extending between the first plane and the second plane.

A method as exemplified herein may comprise providing wire-like material (for instance, 24 in FIGS. 4 and 5) electrically coupling the leadframe to the at least one semiconductor chip on the chip mounting portion, wherein providing said wire-like material may comprise applying clamping (for instance, at A) to the leadframe wherein the method may comprise refraining (for instance, at 102 in FIG. 5) from applying clamping to said at the least one lead in the leadframe arranged facing the chip mounting portion.

Now described with reference to FIG. 10 is a single layer system-in-package (SiP) device 300 to include a surface mounted passive device (shown in FIG. 11 as device 302). As shown in FIG. 10, in an initial step, leadframe portions 300a, 300b, 300c are formed and placed on a carrier. The leadframe portion 300a may be considered to be a die pad, and the leadframe portions 300b and 300c may be considered to be leads.

As shown in FIG. 11, pad or pads 301 are deposited on the leadframe portion 300a, and a device 302 (e.g., an integrated circuit) is mounted on the pad or pads 301.

Next, referring additionally to FIG. 12, pad or pads 304 are deposited on the leadframe portion 300a, and a passive device (e.g., resistor, capacitor, inductor, etc.) 305 is vertically mounted on the pad or pads 304 with respect to the leadframe portion 300a. The passive device 305 is described as being "vertically mounted" because its longitudinal axis X16 (the axis along the direction of longer or longest extension of the passive device 305) is arranged transverse the pad 304 and the leadframe portion 300a (perpendicular to the plane X12). It is to be noted that the device 302 has pads 303 on its top side, and the passive device 305 likewise has a pad or pads 306 on its top side.

Next, as shown in FIG. 13, a molding layer 309 is formed over the leadframe portions 300a, 300b, 300c, device 302, and passive device 306, and compressed into place. This is performed by placing the entire structure into the cavity of a mold, and the molding material is injected into the cavity. The sides of the mold press against (e.g., clamp) portions of the leadframe portions 300a, 300b, 300c to hold it in place during the molding operation.

The molding layer 309 is comprised of a laser direct structuring (LDS) compatible resin which is infused or implanted with a laser-activated catalyst or particles that, when subjected to certain laser radiation, such as infrared (IR) laser radiation, become activated or exposed to form structured areas. These structured areas may then be turned into conductive areas via metallization.

For example, as shown in FIG. 13, the molding layer 309 may have particles such as copper-chromium oxide spinel, copper sulfate, copper hydroxide phosphate, or cupric rhodanate embedded therein. The molding layer 309 is cured.

Next, as shown in FIG. 14, cavities 307a, 307b, 307c, 307d, and 308 are formed by laser drilling the molding layer 309. Thereafter, a laser light is used to form a desired pattern of structured areas in the molding layer 309 by activating or exposing the catalyst in the walls of the via cavities 308a, 307b, 307c, 307d, and 308, as shown in FIG. 14. By structured area, it is meant an area in the molding layer 309 where the catalyst has been activated or exposed due to application of a laser light to the relevant portion of the molding layer 309. As will be explained below, structured areas can be metallized to form conductive areas.

For example, laser activation can be applied to the walls of the via cavities 307a and 307b to structure those walls, and laser activation can be applied to the walls of the via cavities 307c, 307d, and 308 to structure those walls. Thereafter, as shown in FIG. 15, a metallization process is performed to metallize the via cavities 307a and 307b and form a trace connecting them, as well as to metallize the via cavities 307c, 307d, and 308 and form a trace connecting them. This metallization process may include a copper electroless deposition, where an appropriate wet chemical bath reacts with exposed chromium particles within the molding layer 309 to create a thin (e.g., 5 μm in thickness) copper pattern on the patterns of structured areas on the molding layer 309. This thin copper pattern can be thickened through electrodeposition to reach a desired thickness (e.g., 10 μm) that properly forms the vias within the via cavities 307a and 307b, and 307c, 307d, and 308 and properly forms the traces.

Next, a passivation layer 313 is formed (e.g., such as by deposition or over-molding), shown in FIG. 16, and the bottom of the leadframe portions 300a, 300b, 300c are tin plated to form tin portions 310a, 310b, 310c, shown in FIG. 17. Finally, the SiP device 300 is singulated with a saw blade or laser cutting tool into individual SiP devices 350a and 350b, shown in FIG. 18. During this process, unneeded portions of the leadframe portions 300a, 300b, and 300c may be severed and disposed of. It should be noticed that the SiP device 350b is identical to the SiP device 350a, but reference numerals and lead lines are not shown for the SiP device 350b for ease of readability of the drawing figures.

Without prejudice to the underlying principles, the details and embodiments may vary, even significantly, with respect to what has been described by way of example only, without departing from the extent of protection. The extent of protection is determined by the annexed claims.

The invention claimed is:

1. A method of making a device, comprising:
attaching a semiconductor chip to a chip mounting portion on at least one leadframe portion, and attaching a passive component on a passive component mounting portion of the at least one leadframe portion;
forming a laser direct structuring (LDS) activatable molding material over the semiconductor chip, the passive component, and the at least one leadframe portion;
forming desired patterns of structured areas within the LDS activatable molding material by activating the LDS activatable molding material;
metallizing the desired patterns of structured areas to form conductive areas within the LDS activatable molding material to thereby form electrical connection between the semiconductor chip and the passive component; and
forming a passivation layer on the LDS activatable molding material.

2. The method of claim 1, wherein the semiconductor chip is attached to the chip mounting portion such that a longitudinal axis of the passive component is transverse to the passive component mounting portion.

3. The method of claim 1, wherein the at least one leadframe portion comprises first and second leadframe portions; wherein attaching the semiconductor chip comprises attaching the semiconductor chip to a chip mounting portion on the first leadframe portion; and wherein attaching the passive component comprises attaching the passive component to a passive component mounting portion on the first leadframe portion.

4. The method of claim 1, wherein the at least one leadframe portion comprises first and second leadframe portions; wherein attaching the semiconductor chip comprises attaching the semiconductor chip to a chip mounting portion on the first leadframe portion; and wherein attaching the passive component comprises attaching the passive component to a passive component mounting portion on the second leadframe portion.

5. The method of claim 1, further comprising attaching a second semiconductor chip to a second chip mounting portion on at least one additional leadframe portion, and attaching a second passive component on a passive component mounting portion of the at least one additional leadframe portion; wherein forming the LDS activatable molding material comprises forming the LDS activatable molding material over the semiconductor chip, the second semiconductor chip, the passive component, the second passive component, and the at least one leadframe portion; and wherein forming the desired patterns of structured areas within the LDS activatable molding material comprises forming the desired patterns of structured areas within the LDS activatable molding material and wherein metallizing comprises metallizing the desired patterns of structured areas to form conductive areas within the LDS activatable molding material to thereby form electrical connections between the semiconductor chip and the passive component, and between the second semiconductor chip and the second passive component.

6. The method of claim 5, wherein the at least one leadframe portion comprises first and second leadframe portions; wherein attaching the semiconductor chip comprises attaching the semiconductor chip to a chip mounting portion on the first leadframe portion; wherein attaching the second semiconductor chip comprises attaching the second semiconductor chip to a second chip mounting portion on the second leadframe portion; wherein attaching the passive component comprises attaching the passive component to a passive component mounting portion on the first leadframe portion; and wherein attaching the second passive component comprises attaching the second passive component to a second passive component mounting portion on the second leadframe portion.

7. The method of claim 6, further comprising singulating the device into:
a first device comprised of the first leadframe portion, the semiconductor chip, the passive component, and corresponding portions of the LDS activatable molding material and passivation layer; and
a second device comprised of the second leadframe portion, the second semiconductor chip, the second passive component, and corresponding portions of the LDS activatable molding material and passivation layer.

8. The method of claim 1, wherein metallizing the desired patterns of structured areas within the LDS activatable molding material comprises performing an electroless deposition on the desired patterns of structured areas to thereby form a thin pattern, and then performing an electrodeposition to thicken the pattern to thereby form the conductive areas within the LDS activatable molding material.

9. A method of forming a semiconductor device, comprising:
attaching a first semiconductor chip to a chip mounting portion of a leadframe;
securing a first passive component to a first passive component mounting portion of the leadframe;
forming an LDS activatable molding material over the first semiconductor chip, the first passive component, and the leadframe;
activating selected areas of the LDS activatable molding material with laser energy to form structured areas;
metallizing the structured areas within the LDS activatable molding material to create conductive paths that electrically connect the first semiconductor chip and the first passive component; and
applying a passivation layer over the LDS activatable molding material to protect the created electrical connections.

10. The method of claim 9, further comprising:
performing an electroless deposition process on the activated selected areas within the LDS activatable molding material to form a thin conductive pattern; and
subsequently performing an electrodeposition process on the thin conductive pattern to increase thickness of the conductive paths within the LDS activatable molding material, thereby completing the creation of the electrical connections between the first semiconductor chip and the first passive component.

11. The method of claim 9, wherein attaching the first semiconductor chip to the chip mounting portion is performed such that a longitudinal axis of the first passive component is arranged to be transverse to the first passive component mounting portion, allowing for the first passive component to extend perpendicular to a major surface of the chip mounting portion.

12. The method of claim 9, wherein the leadframe includes a first leadframe portion and a second leadframe portion, and wherein attaching the first semiconductor chip to the chip mounting portion comprises securing the first semiconductor chip to the chip mounting portion on the first leadframe portion, and attaching the first passive component comprises securing the first passive component to the passive component mounting portion also on the first leadframe portion, thereby integrating both the first semiconductor chip and the first passive component on a same leadframe portion.

13. The method of claim 9, wherein the leadframe includes a first leadframe portion and a second leadframe portion, attaching the first semiconductor chip to the chip mounting portion includes securing the first semiconductor chip to the chip mounting portion on the first leadframe portion, and attaching the first passive component includes securing the first passive component to a passive component mounting portion on the second leadframe portion, thus spatially segregating the first semiconductor chip and the first passive component on distinct leadframe portions.

* * * * *